US011175691B1

(12) United States Patent
Tyminski et al.

(10) Patent No.: US 11,175,691 B1
(45) Date of Patent: Nov. 16, 2021

(54) POWER-OPTIMIZED RANGING SEQUENCE BY SNAPSHOT CLOCK SWITCHING

(71) Applicant: NXP B.V., Eindhoven (NL)

(72) Inventors: Jacek Tyminski, Lassnitzhoehe (AT); Wolfgang Kuchler, Graz (AT); Georg Burgler, Gratkorn (AT); Sandeep Mallya, Bangalore (IN); Pradeep Kumar Aithagani, Bangalore (IN); Chinmay Gururaj Kathani, Bangalore (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/076,078

(22) Filed: Oct. 21, 2020

(51) Int. Cl.
*G06F 1/04* (2006.01)
*G06F 1/14* (2006.01)
*G01S 13/08* (2006.01)
*H03L 7/099* (2006.01)

(52) U.S. Cl.
CPC ............... *G06F 1/14* (2013.01); *G01S 13/08* (2013.01); *H03L 7/099* (2013.01); *H03L 2207/06* (2013.01)

(58) Field of Classification Search
CPC . G06F 1/14; G01S 13/08; H03L 7/099; H03L 2207/06
USPC ........................................................ 327/291
See application file for complete search history.

(56) References Cited

U.S. PATENT DOCUMENTS

| 6,292,038 B1 * | 9/2001 | Stachura | H03K 5/1252 327/145 |
| 6,819,150 B1 * | 11/2004 | Santosa | G06F 1/324 327/141 |
| 7,085,952 B2 * | 8/2006 | Huelskamp | G06F 1/08 713/600 |
| 7,106,118 B2 * | 9/2006 | Tang | G06F 1/04 327/291 |
| 7,961,012 B2 * | 6/2011 | Hong | G06F 1/10 327/99 |
| 9,584,139 B2 * | 2/2017 | Wicpalek | H03L 7/1976 |

OTHER PUBLICATIONS

Burdett, "Ultra-Low Power Wireless Systems, Energy-Efficient Radios for the Internet of Things," IEEE Sold-State Circuits Magazine, Spreing 2015, pp. 18-28; 11 pages.

\* cited by examiner

*Primary Examiner* — Ryan Jager

(57) ABSTRACT

A method for optimizing power of a ranging sequence includes counting at least one cycle of a first clock during a Crystal Oscillator (XO)-mode to generate a first cycle count. A second clock is activated at an end of the XO-mode. The first cycle count is converted into a fractional correction value by multiplying the first cycle count by a ratio of a second period of the second clock divided by a first period of the first clock. A first alignment of the first clock to the second clock is determined at a beginning of the XO-mode. A second alignment of the first clock to the second clock is determined at the end of the XO-mode. An adjusted cycle count is determined by summating the fractional correction value with a summation of the first alignment and the second alignment divided by the first period.

20 Claims, 5 Drawing Sheets

POWER-OPTIMIZED RANGING SEQUENCE BY SNAPSHOT CLOCK SWITCHING

FIELD

This disclosure relates generally to power efficient clocking systems, and more specifically to switching between a low-resolution clock and a high-resolution clock without compromising time precision.

BACKGROUND

Ranging systems require precise time measurements to determine a distance of a Radio Frequency (RF) device (e.g., a mobile tag), to at least two reference devices with known physical locations. Performing precise time measurements typically requires a high-resolution clock, such as a Phase-Locked Loop (PLL) with undesirably high-power consumption. While the PLL may be deactivated between time measurements, the time required to reactivate and stabilize the PLL may lead to unacceptable delays or even lost or inaccurate data.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments described herein provide for transitioning between two asynchronous clocks having different frequencies, while compensating for a resulting phase shift therebetween.

In one example embodiment, the two clocks include a PLL having a high time resolution and an external (or a Crystal Oscillator "XO") clock having a lower time resolution and lower power consumption. In an Ultra-WideBand (UWB) ranging application, an RF transceiver is used to determine a Time Difference Of Arrival (TDOA) between an RF device (e.g., a tag), and several reference devices or "anchors" with known locations. The PLL clock is activated and used to determine precise TDOA measurements. Between TDOA measurements, the PLL is deactivated, (or otherwise reduced to a low power state), and the XO clock is used to reduce power consumption. The XO clock maintains the same timing precision as the PLL clock but with less time resolution capability (due to the reduced XO clock frequency). During a transition between a PLL-mode (using the PLL clock) to an XO-mode (using the XO clock) and subsequently back to the PLL-mode, an equivalent number of PLL clock cycles must be determined so that TDOA measurements made during sequential PLL-modes can be effectively compared to determine a physical range.

The equivalent number of PLL clock cycles is determined by converting a count of the number of elapsed XO clock cycles into equivalent PLL clock cycles and by further adjusting to account for clock edge misalignment between the XO clock and the PLL clock, both during the transition to the XO-mode and from the XO-mode. In various embodiments, the resulting equivalent number of PLL clock cycles is a fractional value due to the use of a fractional PLL and due to the incremental time values determined from the clock edge misalignments. In one example embodiment, the equivalent number of PLL clock cycles, (also referred to as a "phase shift"), is determined for each transition between the XO-mode and PLL-mode, either separately or cumulatively, and used in a subsequent step to normalize or correct each TDOA measurement so that a range is determinable.

Figure 1:
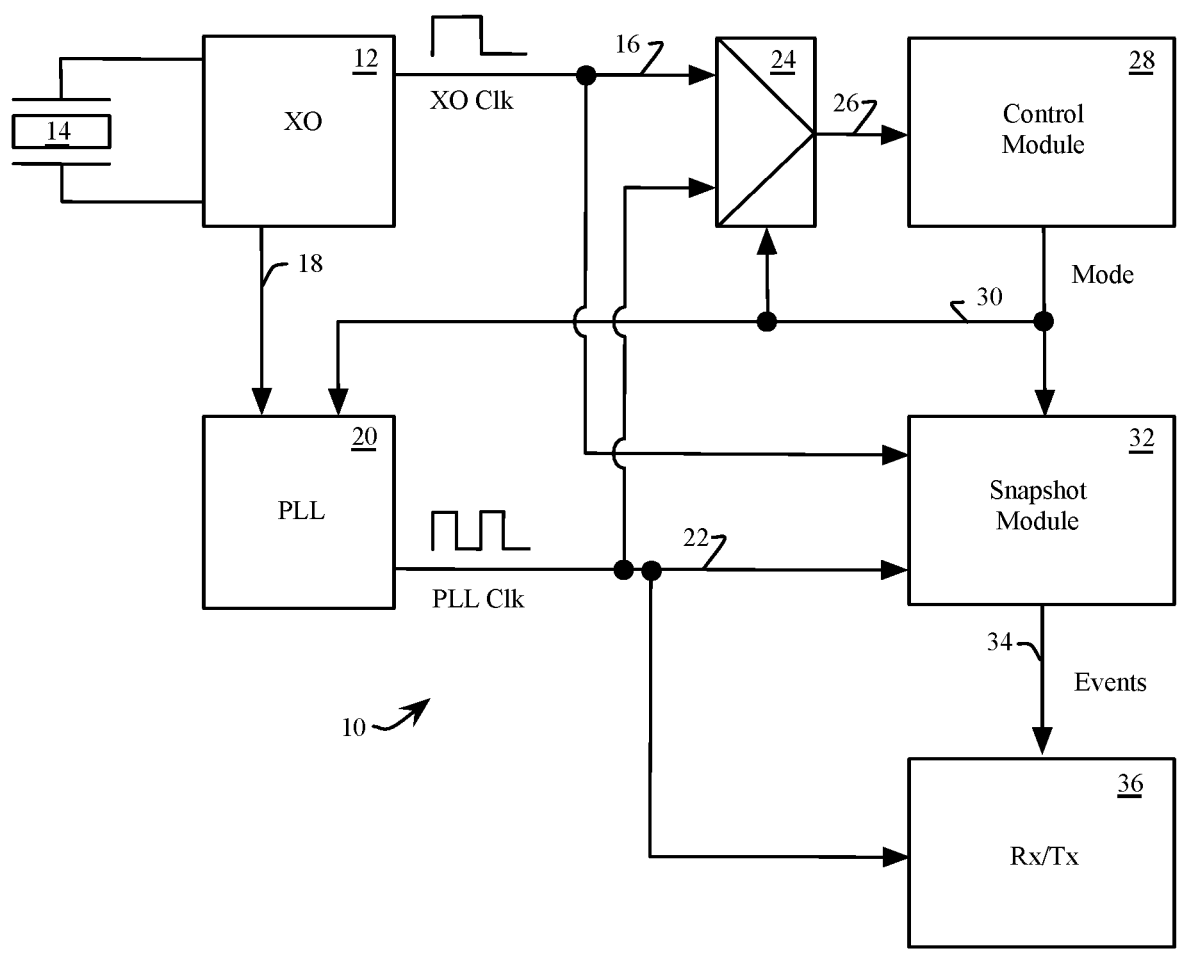
FIG. 1 is a schematic view of an apparatus for a power-optimized ranging sequence by Snapshot Clock switching, in accordance with an example embodiment of the present disclosure.

FIG. 1 is a schematic view of an apparatus for a power-optimized ranging sequence by Snapshot Clock switching, in accordance with an example embodiment 10 of the present disclosure. The embodiment 10 includes a crystal oscillator (XO) 12 configured to oscillate at a resonant frequency of a crystal 14, and to generate XO Clks 16 and 18. A PLL 20 generates a PLL Clk 22. The XO Clk 16 and the PLL Clk 22 are multiplexed by a multiplexor 24 to generate a system clock 26 for a control module 28. The control module 28 generates a mode signal 30 to control the multiplexor 24 and to enable or disable the PLL 20. The mode signal 30 also controls a Snapshot module 32, which receives the XO Clk 16 and the PLL Clk 22. In one embodiment, the Snapshot module 32 determines the phase shift between the XO-mode and PLL-mode to correct TDOA measurements, and provides general control over ranging operations, including generating events 34 for a transceiver 36. The transceiver 36 is configured to transmit an RF signal to a plurality of anchor devices, and to receive an RF signal in response thereto.

Figure 2:
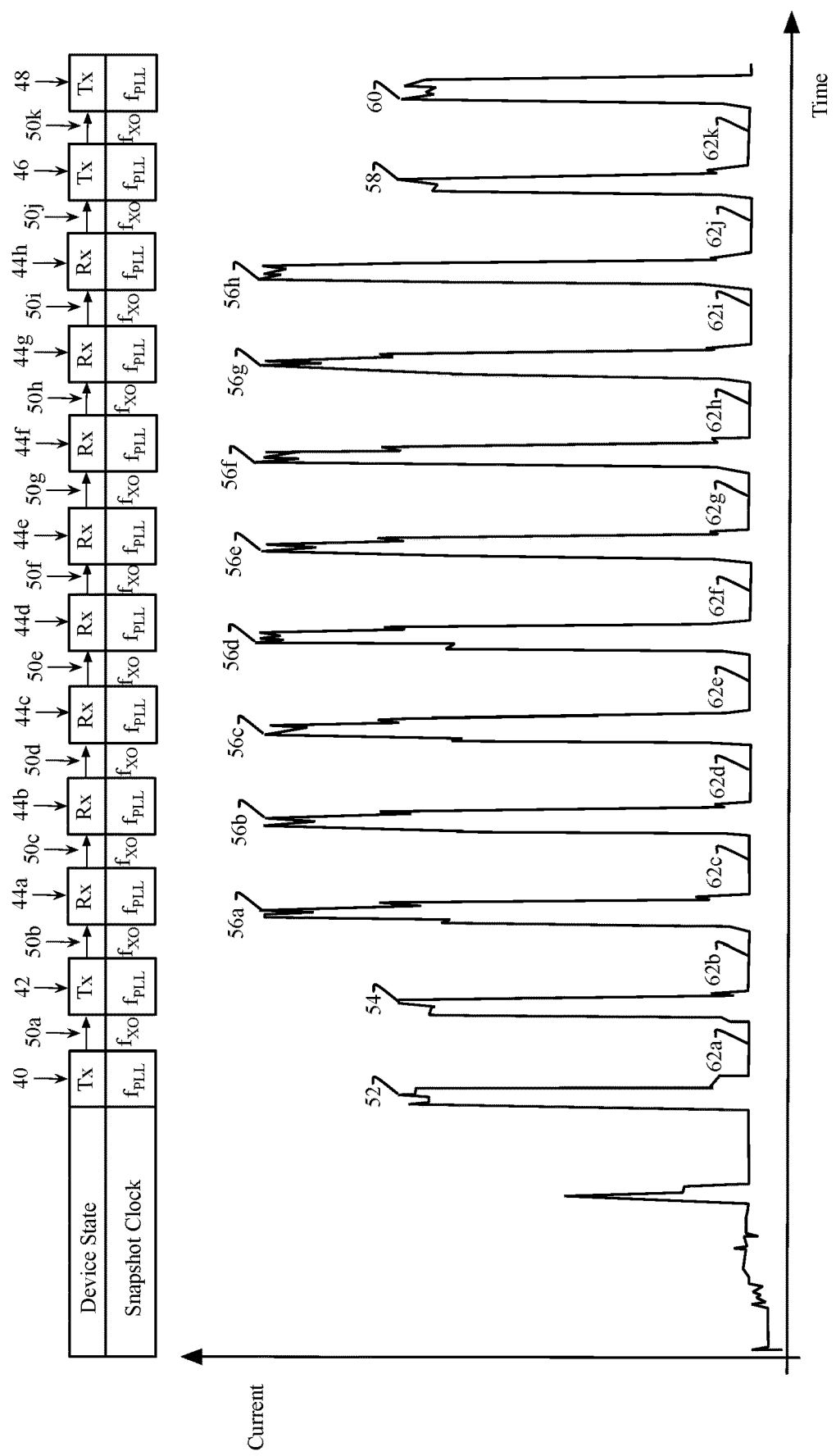
FIG. 2 is an example embodiment of a graphical view of a supply current profile of the apparatus of FIG. 1.

FIG. 2 with continued reference to FIG. 1 shows a change in supply current to the embodiment 10 during a ranging operation. At 40, the Snapshot module 32 instructs the Transceiver 36 to transmit using the PLL Clk 22 for high resolution timing. Accordingly, the power consumption of the embodiment 10 increases to a current level 52. At 42, the Snapshot module 32 instructs the Transceiver 36 to transmit again using the PLL Clk 22 for high resolution timing. Accordingly, the power consumption of the embodiment 10 increases to a current level 54, similar to the current level 52. In one embodiment, the two transmissions at 40 and 42 transmit an RF signal to a plurality of anchors for determining a TDOA. Subsequently, at 44a, 44b, 44c, 44d, 44e, 44f, 44g and 44h (generally 44), the Snapshot module 32 instructs the Transceiver 36 to receive using the PLL Clk 22 for high resolution timing. Accordingly, the power consumption of the embodiment 10 increases to respective current levels 56a, 56b, 56c, 56d, 56e, 56f, 56g and 56h, (generally 56). In one embodiment, each of the received signals 44 represents a returned signal from a respective anchor device. Similar to the transmission at 40 and 42, at 46 and 48, the Snapshot module 32 instructs the Transceiver 36 to transmit using the PLL Clk 22 for high resolution timing. Accordingly, the respective power consumption of the embodiment 10 increases to respective current levels 58 and 60. In one embodiment, the transmissions at 46 and 48 begin a new ranging cycle. Between each sequential transmission or reception, the PLL Clk 22 is deactivated (or reduced to a low power mode) by the mode signal 30 and the XO Clk 16 is used to time the control module 28 and the Snapshot module 32. Each use of the XO Clk 16, shown at 50a, 50b, 50c, 50d, 50e, 50f, 50g, 50h, 50i, 50j and 50k, (generally 50) results in a significant reduction in the power consumption of the embodiment 10 as shown respectively by current levels 62a, 62b, 62c, 62d, 62e, 62f, 62g, 62h, 62i, 62j and 62k, (generally 62).

Figure 3:
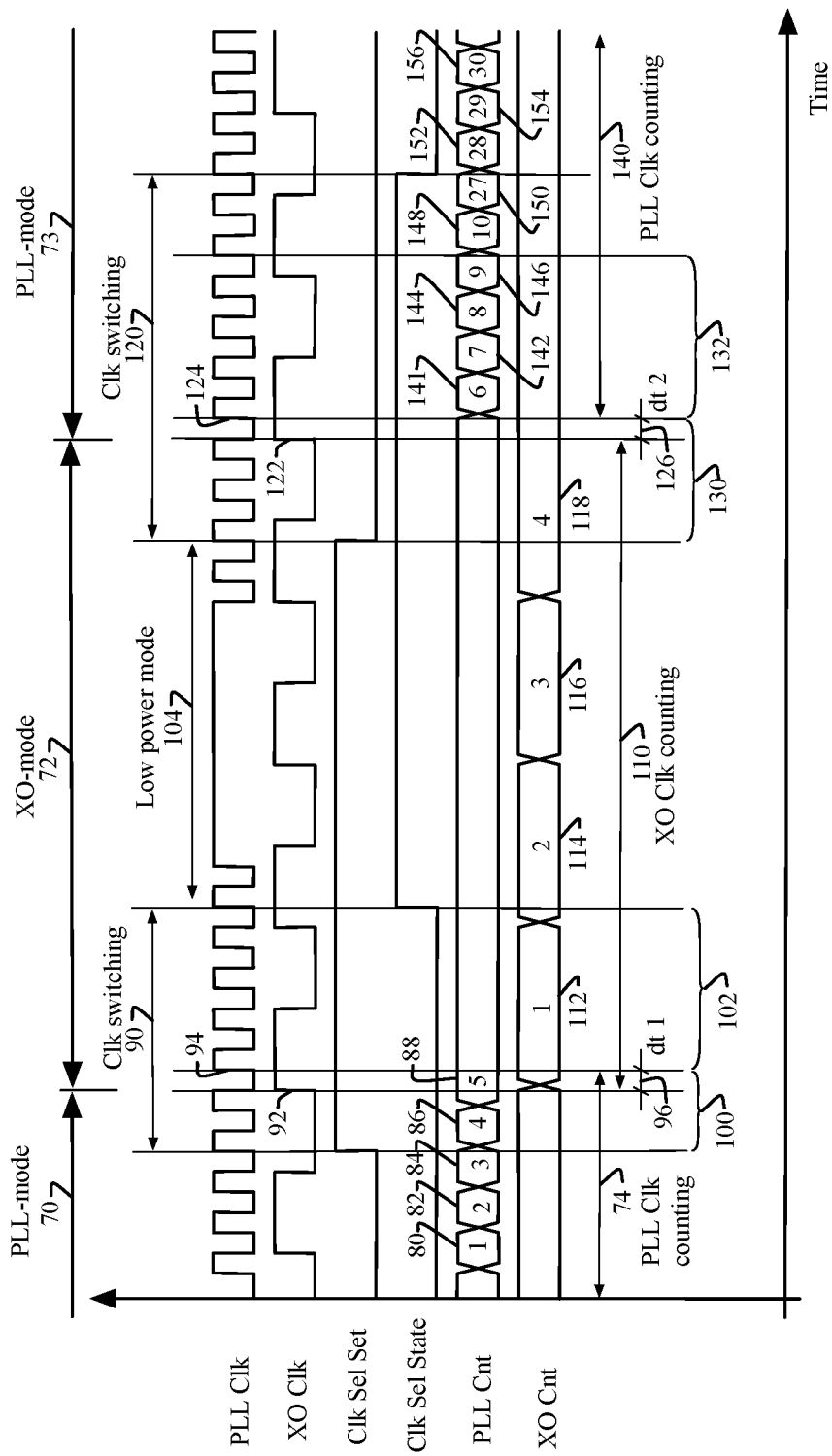
FIG. 3 is an example embodiment of a timing diagram of the apparatus of FIG. 1.

FIG. 3 is an example embodiment of a timing diagram showing an operation of the embodiment 10 of FIG. 1, including the PLL-mode 70, followed by an XO-mode 72 and then a subsequent PLL-mode 73. During the first PLL-mode 70, the Snapshot module 32 counts a plurality of PLL Clks 22 during a PLL Clk counting phase 74. In FIG. 3, a PLL counter (PLL Cnt) counts five cycles 80, 82, 84, 86 and 88 with the high speed PLL Clk 22, where the count values are 1, 2, 3, 4 and 5 respectively.

Upon activating the Clk Sel Set signal with the Control module 28, a rising edge 92 of XO Clk 16 samples the Clk Sel Set signal during a synchronization phase 100 to enter the XO-mode 72, and thereby suspends the PLL Cnt and starts a count with the XO Cnt. A first temporal alignment (dt1) 96 of the XO Clk 16 to the PLL Clk 22 is determined by measuring a delay between the rising 92 of the XO Clk 16 and the rising edge 94 of the PLL Clk22. During a dt1 measurement phase 102, the value of dt1 96 is determined. In one example embodiment, the value of dt1 96 is determined by observing both rising and falling edges of the XO Clk 16 and PLL Clk 22 over several cycles of the XO Clk 16 and inferring the dt1 96 value from the number of cycles required to cause one clock to transition from leading or lagging the other clock. It should be appreciated that other methods for measuring the value of dt1 96 are envisioned, including without limitation an analog delay circuit. Once the value of dt1 96 is determined, the PLL Clk 22 transitions to a low power mode 104. In one example, the low power mode 104 deactivates the PLL 20 by interrupting a bias current.

During the XO-mode 72, the Snapshot module 32 counts a plurality of XO Clks 16 during an XO Clk counting phase 110. In FIG. 3, the XO counter (XO Cnt) counts four cycles 112, 114, 116 and 118 with the low speed XO Clk 16, where the count values are 1, 2, 3 and 4 respectively. Upon deactivating the Clk Sel Set signal with the Control module 28, a rising edge 122 of XO Clk 16 samples the Clk Sel Set signal during a synchronization phase 130 to enter the PLL-mode 73, and thereby suspends the XO Cnt and starts a count with the PLL Cnt. A second temporal alignment (dt2) 126 of the XO Clk 16 to the PLL Clk 22 is determined by measuring a delay between the rising 122 of the XO Clk 16 and the rising edge 124 of the PLL Clk22.

During a dt2 measurement phase 132, the value of dt2 126 is determined. In one example embodiment, the value of dt2 126 is determined by observing both rising and falling edges of the XO Clk 16 and PLL Clk 22 over several cycles of the XO Clk 16 and inferring the dt2 126 value from the number of cycles required to cause one clock to transition from leading or lagging the other clock. It should be appreciated that other methods for measuring the value of dt2 126 are envisioned, including without limitation an analog delay circuit.

During the PLL-mode 73, the Snapshot module 32 counts a plurality of PLL Clks 22 during a PLL Clk counting phase 140. In FIG. 3, the PLL counter (PLL Cnt) counts five cycles 141, 142, 144, 146 and 148 with the high speed PLL Clk 22, where the count values are 6, 7, 8, 9 and 10 respectively, continuing the previous count from the PLL Clk counting phase 74. Once the value of dt2 126 is determined, the PLL Cnt is adjusted to compensate for a phase shift between the PLL Clk 22 and the XO Clk 16 incurred during the low power XO-mode 72. In the example embodiment of FIG. 3, the XO Cnt is converted into a fractional correction value comprising an equivalent number of cycles of the PLL Clk 22, by multiplying the XO Cnt by a ratio of a period of the XO Clk 16 to a period of the PLL Clk 22, 4 counts times 4:1 for an fractional correction value of 16. In the example embodiment of FIG. 3, the values of dt1 96 and dt2 126 are zero, hence the adjusted PLL Cnt at 150 becomes 27 (e.g, the previous count 148 of 10 is incremented to 11 because a single PLL cycle has elapsed, and a correction of 16 is added to 11 to give a corrected count of 27). After the PLL Cnt is adjusted at 150, subsequent count values of 28, 29 and 30 are shown at 152, 154 and 156 respectively.

In another example embodiment, the values of dt1 96 and dt2 126 are not zero and the ratio of the period of the XO Clk to the PLL Clk is a fractional value, particularly when a fractional PLL is used for the PLL 20. In this example, the value of the adjusted clock counts 150, 152, 154 and 156 are 11.6875, 12.6875, 13.6875 and 14.6875 respectively. The degree of precision used for correcting the PLL Cnt depends upon the application requirements of the embodiment 10 (e.g., a UWB ranging system, a WiFi, Cellular or Bluetooth system or the like). In one example embodiment, the adjusted cycle count of the PLL Cnt is set to zero upon reset of the embodiment 10. The PLL Cnt value is then adjusted either separately or cumulatively for each transition from XO-mode 72 to PLL-mode 73. The adjusted count is then used to correct TDOA measurements for each received response 44 from a respective anchor device.

Figure 4:
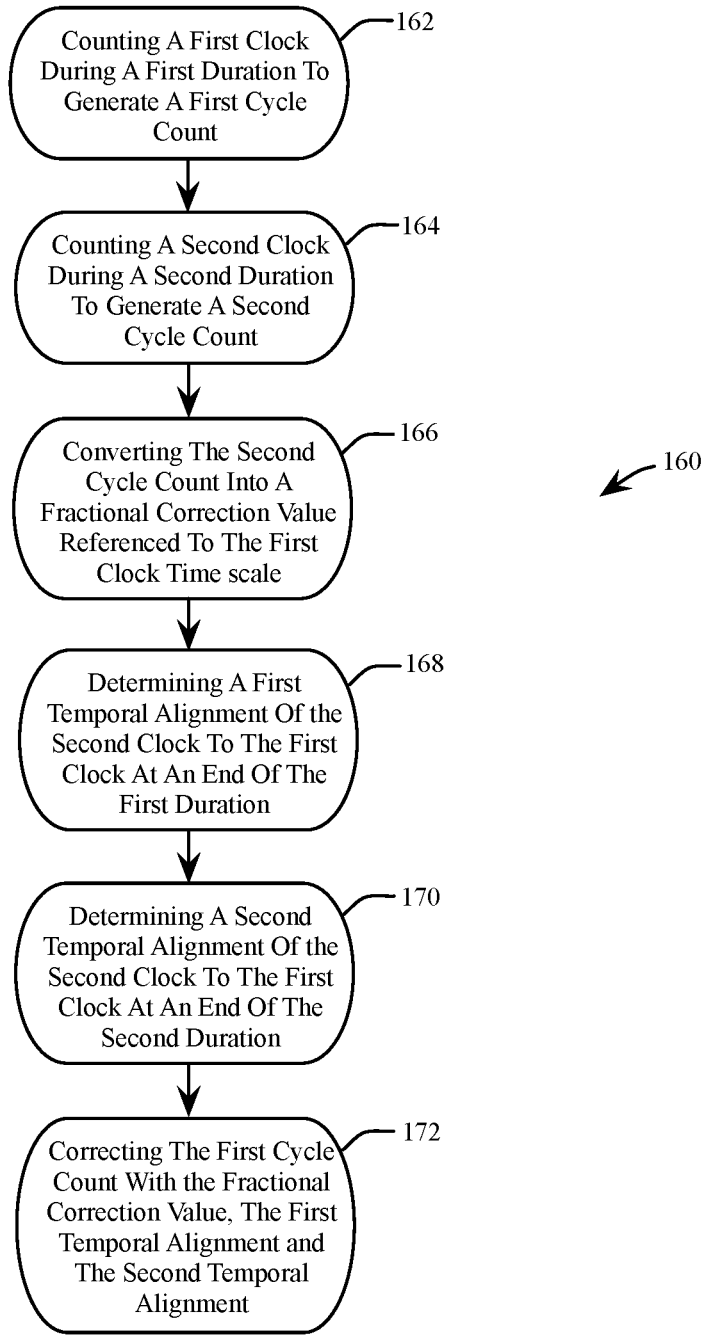
FIG. 4 is a flowchart representation of a method for optimizing power of a ranging sequence by Snapshot Clock switching, in accordance with an example embodiment of the present disclosure.

FIG. 4 with reference to FIG. 1 and FIG. 3, shows an example embodiment 160 of a method for optimizing power of a ranging sequence by Snapshot Clock switching. At 162, a first clock (PLL Clk 22) is counted during a first duration (PLL mode 70) to generate a first cycle count (PLL Cnt). At 164, a second clock (XO Clk 16) is counted during a second duration (XO-mode 72) to generate a second cycle count (XO Cnt). At 166, the second cycle count (XO Cnt) is converted into a fractional correction value (e.g., into an equivalent number of first cycles). At 168, a first temporal alignment (dt1 96) of the second clock (XO Clk 16) to the first clock (PLL Clk 22) is determined. At 170, a second temporal alignment (dt2 126) of the second clock (XO Clk 16) to the first clock (PLL Clk 22) is determined. At 172, the first cycle count (determined at 80-148) is corrected with the fractional correction value, the first temporal alignment and the second temporal alignment, thereby producing the corrected first cycle count at 150.

Figure 5:
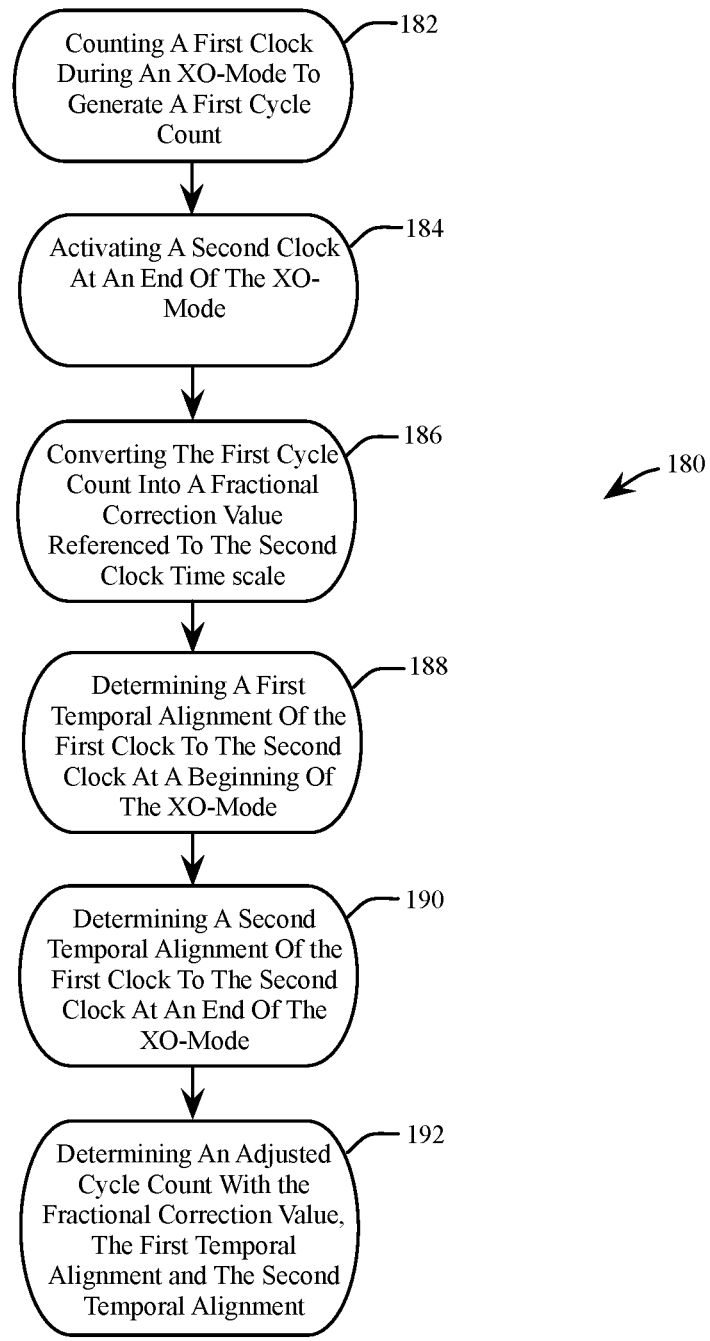
FIG. 5 is a flowchart representation of a method for optimizing power of a ranging sequence by Snapshot Clock switching, in accordance with an example embodiment of the present disclosure.

FIG. 5 with reference to FIG. 1 and FIG. 3, shows an example embodiment 180 of a method for optimizing power of a ranging sequence by Snapshot Clock switching. At 182, a first clock (XO Clk 16) is counted during an XO-mode (72) to generate a first cycle count (XO Cnt). At 184, a second clock (PLL Clk 22) is activated at an end of the XO-mode (72). At 186, the first cycle count (XO Cnt) is converted into a fractional correction value (e.g., into an equivalent number of PLL Clk cycles). At 188, a first temporal alignment (dt1 96) of the first clock (XO Clk 16) to the first clock (PLL Clk 22) is determined at a beginning of the XO-Mode 72. At 190, a second temporal alignment (dt2 126) of the second clock (XO Clk 16) to the first clock (PLL Clk 22) is determined at an end of the XO-Mode 72. At 192, an adjusted cycle count (150) is determined with the fractional correction value, the first temporal alignment and the second temporal alignment.

As will be appreciated, embodiments as disclosed include at least the following. In one embodiment, a method for optimizing power of a ranging sequence by Snapshot Clock switching comprises counting at least one first cycle of a first clock during a first duration to generate a first cycle count, each first cycle comprising a first period. At least one second cycle of a second clock is counted during a second duration to generate a second cycle count, each second cycle comprising a second period, wherein the second duration begins at a first end of the first duration. The second cycle count is converted into a fractional correction value comprising an equivalent number of first cycles. A first temporal alignment of the second clock to the first clock is determined at the first end of the first duration. A second temporal alignment of the second clock to the first clock is determined at a second end of the second duration. The first cycle count is corrected after the second end of the second duration by summating the first cycle count with an adjusted count, wherein the adjusted count equals the fractional correction value summated with a summation of the first temporal alignment and the second temporal alignment divided by the first period.

Alternative embodiments of the method for optimizing power of a ranging sequence by Snapshot Clock switching include one of the following features, or any combination thereof. Converting the second count into the fractional correction value comprises multiplying the second cycle count by a ratio of the second period divided by the first period. A Radio Frequency signal is transmitted from a system comprising a Snapshot module in response to the Snapshot module detecting the first duration. A Radio Frequency signal is received during the first duration in response to an enable signal from a Snapshot module. The first clock is disabled during the second duration. The first cycle count is stopped from incrementing and the first clock changed to a low power mode during the second duration. The first clock is generated by a Phased-Locked Loop, and the second clock is generated by a Crystal Oscillator. A Time-of-Flight measurement is adjusted by correcting the first cycle count corrected with the adjusted count.

In another embodiment, an apparatus comprises a first oscillator configured to oscillate for at least one first cycle during a first duration, each first cycle comprising a first period. A second oscillator is configured to oscillate for at least one second cycle during a second duration beginning at a first end of the first duration, each second cycle comprising a second period. A first counter is configured to count the at least one first cycle to generate a first cycle count. A second counter is configured to count the at least one second cycle to generate a second cycle count. A Snapshot module is connected to the first oscillator and the second oscillator, the Snapshot module configured to determine a first temporal alignment of the second oscillator to the first oscillator at the first end of the first duration and a second temporal alignment of the second oscillator to the first oscillator at a second end of the second duration, the Snapshot module configured to convert the second cycle count into a fractional correction value comprising an equivalent number of first cycles, and to correct the first cycle count after the second end of the second duration by summating the first count with an adjusted count, wherein the adjusted count equals the summation of the fractional correction value summated with a summation of the first temporal alignment and the second temporal alignment divided by the first period.

Alternative embodiments of the apparatus include one of the following features, or any combination thereof. A transceiver module is connected to the Snapshot module and the first oscillator. The transceiver module is configured to transmit a Radio Frequency signal in response to the Snapshot module detecting the first duration. The transceiver module is configured to receive a Radio Frequency signal in response to the Snapshot module detecting the first duration. A control module is configured to disable the first oscillator and the first counter during the second duration. The first oscillator is a Phased-Locked Loop. The second oscillator is a Crystal Oscillator. The Snapshot module is configured to adjust a Time-of-Flight measurement with the first cycle count corrected with the adjusted count.

In another embodiment, a method for optimizing power of a ranging sequence by Snapshot Clock switching comprises counting at least one cycle of a first clock during a Crystal Oscillator (XO)-mode to generate a first cycle count. A second clock is activated at an end of the XO-mode. The first cycle count is converted into a fractional correction value by multiplying the first cycle count by a ratio of a second period of the second clock divided by a first period of the first clock. A first temporal alignment of the first clock to the second clock is determined at a beginning of the XO-mode. A second temporal alignment of the first clock to the second clock is determined at the end of the XO-mode. An adjusted cycle count is determined by summating the fractional correction value with a summation of the first temporal alignment and the second temporal alignment divided by the first period.

Alternative embodiments of the method for optimizing power of a ranging sequence by Snapshot Clock switching include one of the following features, or any combination thereof. At least one Radio Frequency device transceives when the second clock is activated. The first cycle count after the XO-mode is corrected by summating the first count with the adjusted cycle count. A phase shift between a first Time-of-Flight (ToF) measurement made before the XO-mode and a second ToF measurement made after the XO-mode is corrected by summating the first count with the adjusted cycle count.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for optimizing power of a ranging sequence by Snapshot Clock switching comprising:
    counting at least one first cycle of a first clock during a first duration to generate a first cycle count, each first cycle comprising a first period;
    counting at least one second cycle of a second clock during a second duration to generate a second cycle count, each second cycle comprising a second period, wherein the second duration begins at a first end of the first duration;

converting the second cycle count into a fractional correction value comprising an equivalent number of first cycles;

determining a first temporal alignment of the second clock to the first clock at the first end of the first duration;

determining a second temporal alignment of the second clock to the first clock at a second end of the second duration; and correcting the first cycle count after the second end of the second duration by summating the first cycle count with an adjusted count, wherein the adjusted count equals the fractional correction value summated with a summation of the first temporal alignment and the second temporal alignment divided by the first period.

2. The method of claim 1 wherein converting the second count into the fractional correction value comprises multiplying the second cycle count by a ratio of the second period divided by the first period.

3. The method of claim 1 further comprising transmitting a Radio Frequency signal from a system comprising a Snapshot module in response to the Snapshot module detecting the first duration.

4. The method of claim 1 further comprising receiving a Radio Frequency signal during the first duration in response to an enable signal from a Snapshot module.

5. The method of claim 1 further comprising disabling the first clock during the second duration.

6. The method of claim 1 further comprising stopping the first cycle count from incrementing and changing the first clock to a low power mode during the second duration.

7. The method of claim 1 wherein the first clock is generated by a Phased-Locked Loop, and the second clock is generated by a Crystal Oscillator.

8. The method of claim 1 further comprising adjusting a Time-of-Flight measurement by correcting the first cycle count with the adjusted count.

9. An apparatus comprising:
a first oscillator configured to oscillate for at least one first cycle during a first duration, each first cycle comprising a first period;
a second oscillator configured to oscillate for at least one second cycle during a second duration beginning at a first end of the first duration, each second cycle comprising a second period;
a first counter configured to count the at least one first cycle to generate a first cycle count;
a second counter configured to count the at least one second cycle to generate a second cycle count; and
a Snapshot module connected to the first oscillator and the second oscillator, the Snapshot module configured to determine a first temporal alignment of the second oscillator to the first oscillator at the first end of the first duration and a second temporal alignment of the second oscillator to the first oscillator at a second end of the second duration, the Snapshot module configured to convert the second cycle count into a fractional correction value comprising an equivalent number of first cycles, and to correct the first cycle count after the second end of the second duration by summating the first cycle count with an adjusted count, wherein the adjusted count equals the fractional correction value summated with a summation of the first temporal alignment and the second temporal alignment divided by the first period.

10. The apparatus of claim 9 further comprising a transceiver module connected to the Snapshot module and the first oscillator.

11. The apparatus of claim 10 wherein the transceiver module is configured to transmit a Radio Frequency signal in response to the Snapshot module detecting the first duration.

12. The apparatus of claim 10 wherein the transceiver module is configured to receive a Radio Frequency signal in response to the Snapshot module detecting the first duration.

13. The apparatus of claim 9 further comprising a control module configured to disable the first oscillator and the first counter during the second duration.

14. The apparatus of claim 9 wherein the first oscillator is a Phased-Locked Loop.

15. The apparatus of claim 9 wherein the second oscillator is a Crystal Oscillator.

16. The apparatus of claim 9 wherein the Snapshot module is configured to adjust a Time-of-Flight measurement with the first cycle count corrected with the adjusted count.

17. A method for optimizing power of a ranging sequence by Snapshot Clock switching comprising:
counting at least one cycle of a first clock during a Crystal Oscillator (XO)-mode to generate a first cycle count;
activating a second clock at an end of the XO-mode;
converting the first cycle count into a fractional correction value by multiplying the first cycle count by a ratio of a second period of the second clock divided by a first period of the first clock;
determining a first temporal alignment of the first clock to the second clock at a beginning of the XO-mode;
determining a second temporal alignment of the first clock to the second clock at the end of the XO-mode; and
determining an adjusted cycle count by summating the fractional correction value with a summation of the first temporal alignment and the second temporal alignment divided by the first period.

18. The method of claim 17 further comprising transceiving with at least one Radio Frequency device when the second clock is activated.

19. The method of claim 17 further comprising correcting the first cycle count after the XO-mode by summating the first count with the adjusted cycle count.

20. The method of claim 17 wherein a phase shift between a first Time-of-Flight (ToF) measurement made before the XO-mode and a second ToF measurement made after the XO-mode is corrected by summating the first count with the adjusted cycle count.

* * * * *